(12) United States Patent
Zhou

(10) Patent No.: US 9,780,320 B2
(45) Date of Patent: Oct. 3, 2017

(54) LIGHT EMITTING DEVICE

(71) Applicant: SHENZHEN CHINA STAR OPTOELECTRONICS TECHNOLOGY CO. LTD, Guangdong (CN)

(72) Inventor: Kaifeng Zhou, Guangdong (CN)

(73) Assignee: SHENZHEN CHINA STAR OPTOELECTRONICS TECHNOLOGY CO., LTD, Guangdong (CN)

( * ) Notice: Subject to any disclaimer, the term of this patent is extended or adjusted under 35 U.S.C. 154(b) by 0 days.

(21) Appl. No.: 14/890,618

(22) PCT Filed: Sep. 24, 2015

(86) PCT No.: PCT/CN2015/090565
§ 371 (c)(1),
(2) Date: Nov. 12, 2015

(87) PCT Pub. No.: WO2017/049534
PCT Pub. Date: Mar. 30, 2017

(65) Prior Publication Data
US 2017/0084858 A1    Mar. 23, 2017

(30) Foreign Application Priority Data
Sep. 23, 2015 (CN) .......................... 2015 1 0608550

(51) Int. Cl.
*H01L 51/50* (2006.01)

(52) U.S. Cl.
CPC ...... *H01L 51/5016* (2013.01); *H01L 51/5036* (2013.01)

(58) Field of Classification Search
CPC ... H01L 51/50; H01L 51/5016; H01L 51/504; H01L 51/5086; H01L 51/508
See application file for complete search history.

(56) References Cited

U.S. PATENT DOCUMENTS

| 6,515,417 | B1 | 2/2003 | Duggal et al. |
| 2003/0111955 | A1 | 6/2003 | McNulty et al. |
| 2007/0159061 | A1 | 7/2007 | Krummacher et al. |
| 2008/0093977 | A1 | 4/2008 | Bechtel et al. |
| 2009/0231515 | A1* | 9/2009 | Keam ............... G02F 1/133602 349/71 |

(Continued)

FOREIGN PATENT DOCUMENTS

| CN | 101040397 A | 9/2007 |
| CN | 101322247 A | 12/2008 |

(Continued)

*Primary Examiner* — Phuc Dang
(74) *Attorney, Agent, or Firm* — Mark M. Friedman

(57) ABSTRACT

A white light emitting diode device includes a substrate, an ultraviolet light source generating panel and a photoluminescent layer. The ultraviolet light source generating panel is disposed on a first surface of the substrate. The ultraviolet light source generating panel is used for generating ultraviolet light. The photoluminescent layer is disposed on a second surface of the substrate. The photoluminescent layer is used for generating white light when the photoluminescent layer is irradiated by the ultraviolet light.

19 Claims, 5 Drawing Sheets

(56) References Cited

U.S. PATENT DOCUMENTS

| | | | |
|---|---|---|---|
| 2009/0316429 A1* | 12/2009 | Ramuz | G01N 21/7703 362/558 |
| 2010/0244062 A1 | 9/2010 | Ueno | |
| 2013/0006118 A1* | 1/2013 | Pan | A61N 5/0616 600/476 |
| 2014/0077167 A1* | 3/2014 | Liu | H01L 27/288 257/40 |

FOREIGN PATENT DOCUMENTS

| | | |
|---|---|---|
| CN | 101810063 A | 8/2010 |
| TW | 200614535 A | 5/2006 |
| TW | 480899 B | 7/2014 |

* cited by examiner

LIGHT EMITTING DEVICE

BACKGROUND OF THE INVENTION

1. Field of the Invention

The present invention relates to a light source, and particularly to a light emitting device.

2. Description of the Related Art

A White Organic Light Emitting Diode (WOLED) can be used as a light source applied in a lighting field or a display field.

A WOLED is generally divided into two types: a WOLED with a single light-emitting layer and a WOLED with a multiple light-emitting layers. A WOLED with a single light-emitting layer generally achieves mixed white light by doping differently colored light emitting materials with predetermined concentrations into the light-emitting layer. It is difficult to control the doping concentrations of the light-emitting materials in the WOLED with a single light-emitting layer; interference exists between the differently colored light-emitting materials, whereby it is difficult to obtain pure white light. A WOLED with multiple light-emitting layers generally generates white light through three stacked red, green, and blue light-emitting materials. A mixture of the three colored light obtains the white light. Manufacture of the WOLED with multiple light-emitting layers is complicated. Moreover, the differently colored light emitting materials in different layers will absorb energy from each other, resulting in a reduced lighting efficiency.

In summary, the manufacture of a traditional WOLED is complicated, the lighting efficiency thereof is not high, and the quality of the white light obtained thereby is not good enough.

Thus, it is necessary to provide a new technical solution which can solve the technical problems mentioned above.

SUMMARY OF THE INVENTION

The present invention aims to provide a light emitting device, which can be manufactured through a simpler process, and has a higher luminous stability and a longer life.

To solve the problems mentioned above, the technical solution of the present invention is as follows:

A light emitting device is provided, which comprises a substrate, the substrate including a first surface and a second surface; an ultraviolet light source generating panel disposed on the first surface of the substrate, the ultraviolet light source generating panel being used for generating ultraviolet light; a photoluminescent layer disposed on the second surface of the substrate, the photoluminescent layer being used for generating white light when the photoluminescent layer is irradiated by the ultraviolet light; the ultraviolet light source generating panel comprising an anode layer, a cathode layer, an electroluminescent ultraviolet light emitting material layer disposed between the anode layer and the cathode layer, the electroluminescent ultraviolet light emitting material layer being used for generating the ultraviolet light when there is a predetermined voltage difference between the anode layer and the cathode layer, and a power supply being used for applying a voltage to the anode layer and the cathode layer to form the predetermined voltage difference between the anode layer and the cathode layer; the ultraviolet light source generating panel further comprising a hole injection layer, a hole transport layer, an electronic transport layer, and an electronic injection layer, wherein the hole injection layer is disposed between the anode layer and the hole transport layer, the electroluminescent ultraviolet emitting material layer is disposed between the hole transport layer and the electronic transport layer, the electronic injection layer is disposed between the electronic transport layer and the cathode layer; the photoluminescent layer comprising a photoluminescent blue light emitting material used for emitting blue light when the photoluminescent blue light emitting layer is irradiated by the ultraviolet light, a photoluminescent green light emitting material used for emitting green light when the photoluminescent green light emitting layer is irradiated by the ultraviolet light, and a photoluminescent red light emitting material used for emitting red light when the photoluminescent red light emitting layer is irradiated by the ultraviolet light.

In the aforementioned light emitting device, the photoluminescent layer comprises a first stratification, the photoluminescent green light emitting material, the photoluminescent red light emitting material and the photoluminescent blue light emitting material all being located in the first stratification.

In the aforementioned light emitting device, the photoluminescent blue light emitting material, the photoluminescent green light emitting material and the photoluminescent red light emitting material are all disposed in the first stratification in a form of blocks or a granules.

In the aforementioned light emitting device, a combination of the photoluminescent blue light emitting material, the photoluminescent green light emitting material and the photoluminescent red light emitting material are arranged in a form of a one-dimensional array.

In the aforementioned light emitting device, a combination of the photoluminescent blue light emitting material, the photoluminescent green light emitting material and the photoluminescent red light emitting material are arranged in a form of a two-dimensional array.

In the aforementioned light emitting device, the photoluminescent blue light emitting material, the photoluminescent green light emitting material and the photoluminescent red light emitting material are randomly mixed in the first stratification.

In the aforementioned light emitting device, the photoluminescent layer comprises: a second stratification, the photoluminescent green light emitting material being located in the second stratification; a third stratification, the photoluminescent red light emitting material being located in the third stratification; and a fourth stratification, the photoluminescent blue light emitting material being located in the fourth stratification.

A light emitting device, which comprises a substrate including a first surface and a second surface, an ultraviolet light source generating panel disposed on the first surface of the substrate, the ultraviolet light source generating panel being used for generating ultraviolet light, a photoluminescent layer disposed on the second surface, the photoluminescent layer being used for generating white light when the photoluminescent layer is irradiated by the ultraviolet light.

In the aforementioned light emitting device, the ultraviolet light source generating panel comprises an anode layer, a cathode layer, an electroluminescent ultraviolet light emitting material layer, the electroluminescent ultraviolet light emitting material layer being disposed between the anode layer and the cathode layer, the electroluminescent ultraviolet light emitting material layer being used for generating the ultraviolet light when there is a predetermined voltage difference between the anode layer and the cathode layer; and a power supply being used for applying a voltage to the anode layer and the cathode layer to form the predetermined voltage difference between the anode layer and the cathode layer.

In the aforementioned light emitting device, the ultraviolet light source generating panel further comprises a hole injection layer, a hole transport layer; an electronic transport layer, and an electronic injection layer, wherein the hole injection layer is disposed between the anode layer and the hole transport layer, the electroluminescent ultraviolet light emitting material layer is disposed between the hole transport layer and the electronic transport layer, and the electronic injection layer is disposed between the electronic transport layer and the cathode layer.

In the aforementioned light emitting device, the photoluminescent layer comprises a photoluminescent blue light emitting material used for emitting blue light when the photoluminescent blue light emitting material is irradiated by the ultraviolet light; a photoluminescent green light emitting material used for emitting green light when the photoluminescent green light emitting material is irradiated by the ultraviolet light; and a photoluminescent red light emitting material used for emitting red light when the photoluminescent red light emitting material is irradiated by the ultraviolet light.

In the aforementioned light emitting device, the photoluminescent layer comprises a first stratification, the photoluminescent green light emitting material, the photoluminescent red light emitting material and the photoluminescent blue light emitting material all being located in the first stratification.

In the aforementioned light emitting device, the photoluminescent blue light emitting material, the photoluminescent green light emitting material and the photoluminescent red light emitting material are all disposed in the first stratification in a form of blocks or granules.

In the aforementioned light emitting device, a combination of the photoluminescent blue light emitting material, the photoluminescent green light emitting material and the photoluminescent red light emitting material are arranged in a form of a one-dimensional array.

In the aforementioned light emitting device, a combination of the photoluminescent blue light emitting material, the photoluminescent green light emitting material and the photoluminescent red light emitting material are arranged in a form of a two-dimensional array.

In the aforementioned light emitting device, the photoluminescent blue light emitting material, the photoluminescent green light emitting material and the photoluminescent red light emitting material are randomly mixed in the first stratification.

In the aforementioned light emitting device, the photoluminescent layer comprises: a second stratification, the photoluminescent green light emitting material being located in the second stratification; a third stratification, the photoluminescent red light emitting material being located in the third stratification; and a fourth stratification, the photoluminescent blue light emitting material being located in the fourth stratification.

In the aforementioned light emitting device, for a plane on which the photoluminescent layer is located, a sum of a projected area of the photoluminescent green light emitting material to the plane is a first area, a sum of a projected area of the photoluminescent red light emitting material to the plane is a second area, a sum of a projected area of the photoluminescent blue light emitting material to the plane is a third area; any one of the first area, the second area and the third area equals another one of the first area, the second area and the third area which multiplies a predetermined ratio, the predetermined ratio being in a range from 90% to 110%.

In the aforementioned light emitting device, the first area equals the second area, and the second area equals the third area.

In the aforementioned light emitting device, a yield of the green light of the photoluminescent green light emitting material corresponds to the first area and a first thickness of the stratification in which the photoluminescent green light emitting material is located; a yield of the green light of the photoluminescent red light emitting material corresponds to the second area and a second thickness of the stratification in which the photoluminescent red light emitting material is located; and a yield of the blue light of the photoluminescent blue light emitting material corresponds to the third area and a third thickness of the stratification in which the photoluminescent blue light emitting material is located.

Compared to the existing technology, the light emitting device of the present invention can be manufactured through a simpler process, and has a higher luminous stability and a longer life.

BRIEF DESCRIPTION OF THE DRAWINGS

The accompanying drawings are included to provide a further understanding of the invention, and are incorporated into, and constitute a part of, this specification. The drawings illustrate embodiments of the invention and, together with the description, serve to explain the principles of the invention.

DESCRIPTION OF THE EMBODIMENTS

As used in this specification the term "embodiment" means an instance, an example, or an illustration. In addition, for the articles in this specification and the appended claims, "a" or "an" in general can be interpreted as "one or more" unless specified otherwise or clear from context to determine the singular form.

The light emitting device of the present invention can be an organic light emitting diode (OLED) and in particular can be a White Organic Light Emitting Diode (WOLED). The light emitting device is used for generating the white light. The white light generated by the light emitting device can be used for illumination, or used as a backlight source of a display panel.

Figure 1:
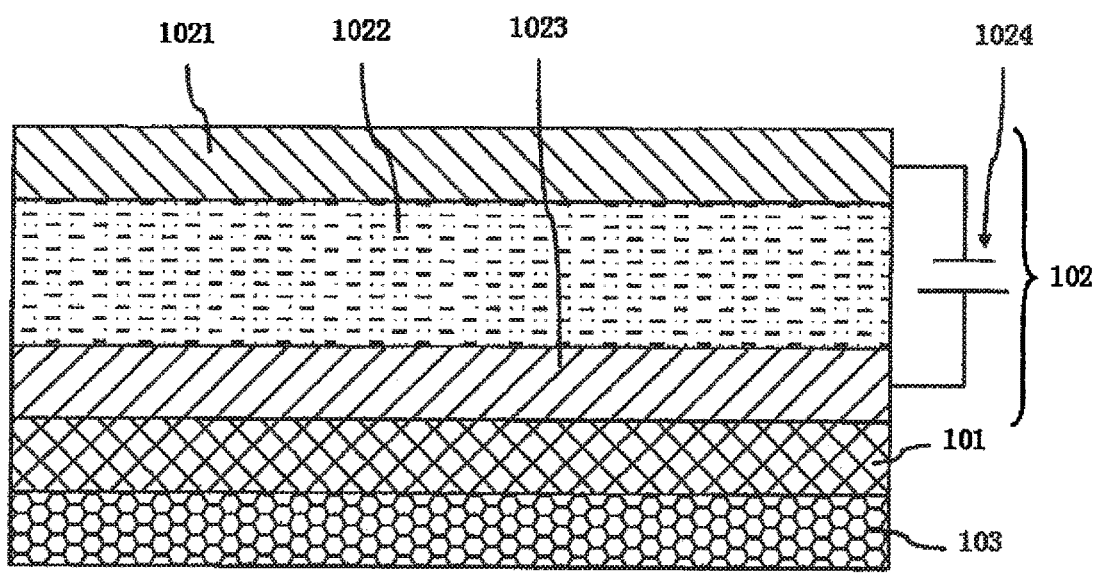
FIG. 1 illustrates a diagram, in cross section, of a first embodiment of the light emitting device of the present invention.

Refer to FIG. 1, which illustrates a diagram, in cross section, of a first embodiment of the light emitting device of the present invention.

The light emitting device of the embodiment includes a substrate 101, an ultraviolet light source generating panel 102, and a photoluminescent layer 103.

The substrate 101 includes a first surface and a second surface.

The ultraviolet light source generating panel 102 is disposed on the first surface of the substrate 101, and the ultraviolet light source generating panel 102 is used for generating ultraviolet light.

The photoluminescent layer 103 is disposed on the second surface of the substrate 101, and the photoluminescent layer 103 is used for generating white light when the photoluminescent layer 103 is irradiated by the ultraviolet light.

In the embodiment, the ultraviolet light source generating panel 102 includes an anode layer 1023, a cathode layer 1021, an electroluminescent ultraviolet light emitting material layer 1022, and a power supply 1024.

The anode layer 1023 is disposed on the first surface of the substrate 101. The electroluminescent ultraviolet light emitting material layer 1022 is disposed between the anode layer 1023 and the cathode layer 1021. The electroluminescent ultraviolet light emitting material layer 1022 is used for generating the ultraviolet light when there is a predetermined voltage difference between the anode layer 1023 and the cathode layer 1021.

The power supply 1024 is used for applying a voltage to the anode layer 1023 and the cathode layer 1021 to form the predetermined voltage difference between the anode layer 1023 and the cathode layer 1021.

Figure 3:
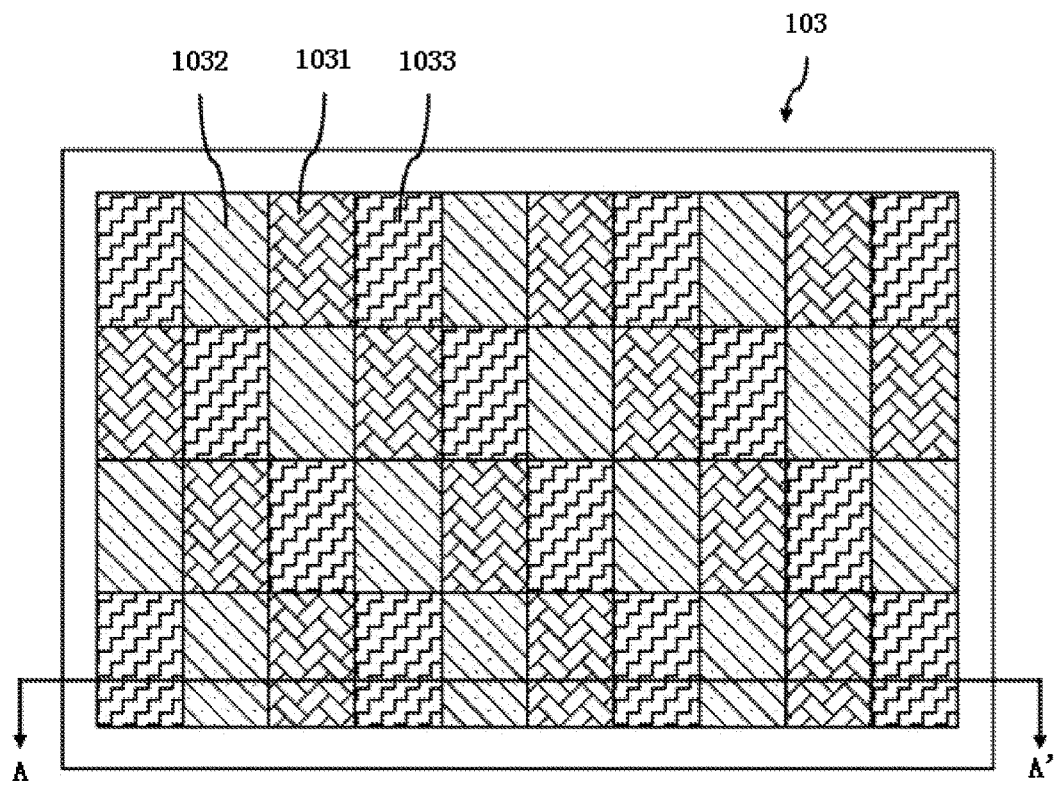
FIG. 3 illustrates a diagram, in a plan view, of a first embodiment of the photoluminescent layer in FIG. 1 or FIG. 2.

Also referring to FIG. 3, in the embodiment, the photoluminescent layer 103 includes a photoluminescent blue light emitting material 1031, a photoluminescent green light emitting material 1032, and a photoluminescent red light emitting material 1033.

The photoluminescent blue light emitting material 1031 is used for emitting/generating blue light when the photoluminescent blue light emitting material 1031 is irradiated by the ultraviolet light.

The photoluminescent green light emitting material 1032 is used for emitting/generating green light when the photoluminescent green light emitting material 1032 is irradiated by the ultraviolet light.

The photoluminescent red light emitting material 1033 is used for emitting/generating red light when the photoluminescent red light emitting material 1033 is irradiated by the ultraviolet light.

The photoluminescent layer 103 is used for allowing the generated red light and the generated green light and the generated blue light passing therethrough to mix together to form the white light.

Figure 2:
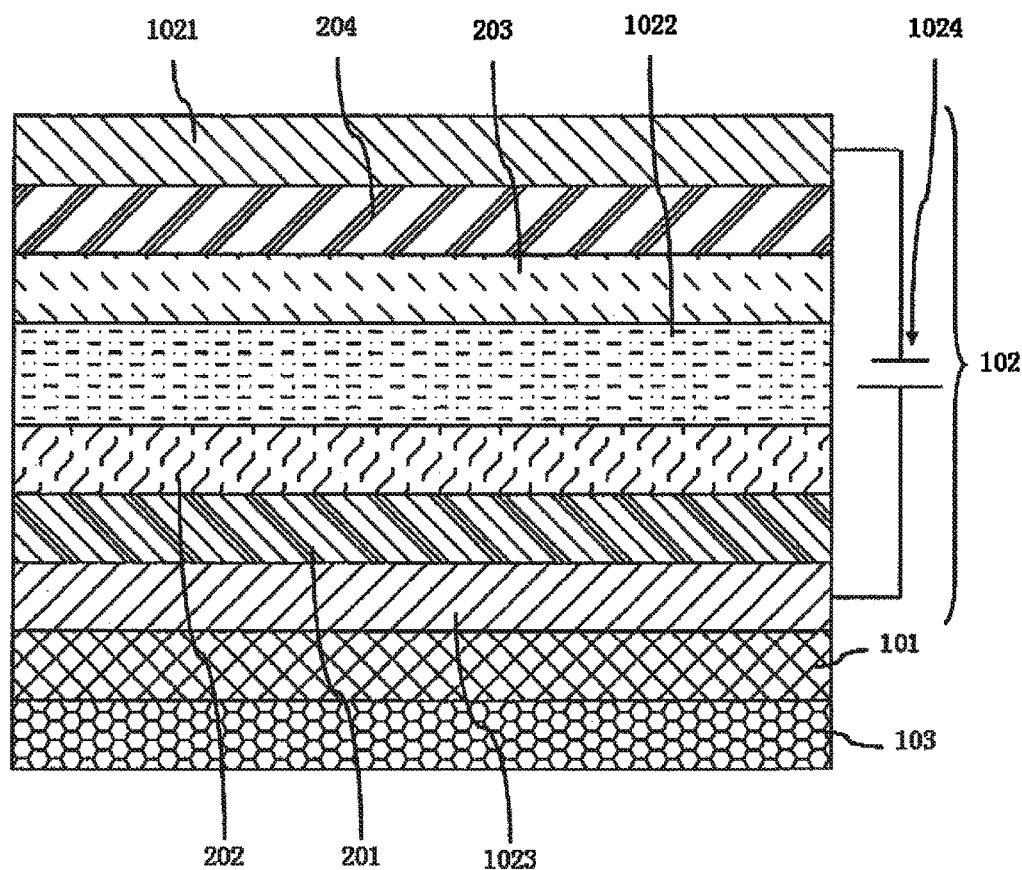
FIG. 2 illustrates a diagram, in cross section, of a second embodiment of the light emitting device of the present invention.
Figure 4:
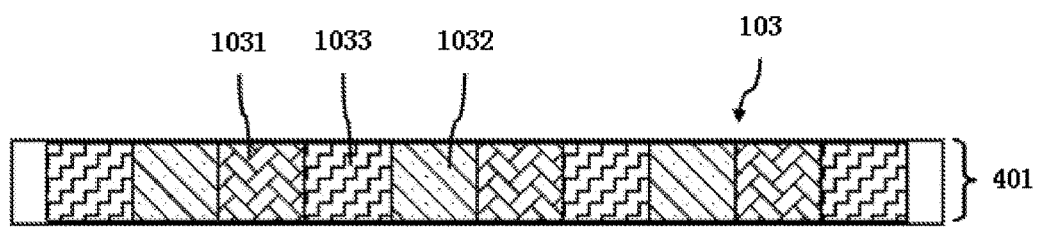
FIG. 4 illustrates a cross-sectional view of the photoluminenscent layer of FIG. 3, taken along line A-A' thereof.
Figure 5:
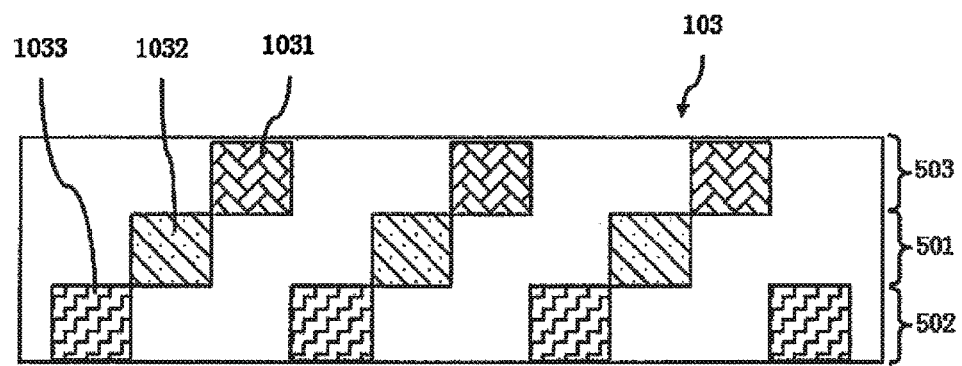
FIG. 5 illustrates a cross-sectional view of the photoluminenscent layer of FIG. 3, taken along line A-A' thereof, showing an alternative embodiment.

Refer to FIG. 3, FIG. 4, and FIG. 5. FIG. 3 illustrates a diagram of a first embodiment of the photoluminescent layer 103 in FIG. 1 or FIG. 2, FIG. 4 illustrates a cross section of the first embodiment of the photoluminescent layer 103 taken along line A-A' of FIG. 3, and FIG. 5 illustrates a cross section of an alternative embodiment of the photoluminescent layer 103.

Referring to FIG. 4, the first embodiment of the photoluminescent layer 103 includes a first stratification 401. The photoluminescent green light emitting material 1032, the photoluminescent red light emitting material 1033, and the photoluminescent blue light emitting material 1031 all being located in the first stratification 401.

Figure 6:
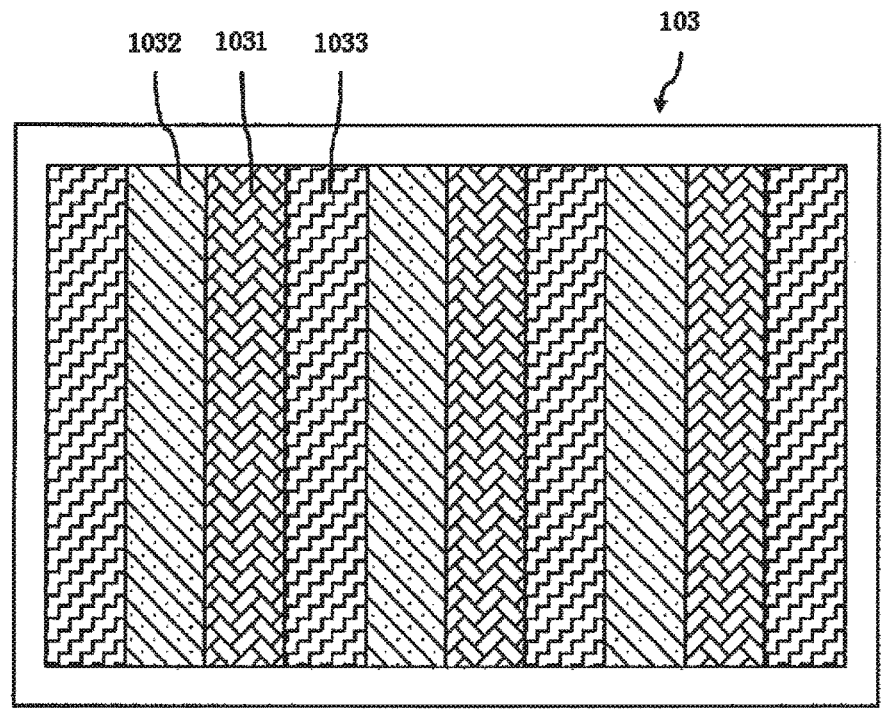
FIG. 6 illustrates a diagram, in a plain view, of a second embodiment of the photoluminescent layer in FIG. 1 or FIG. 2.
Figure 7:
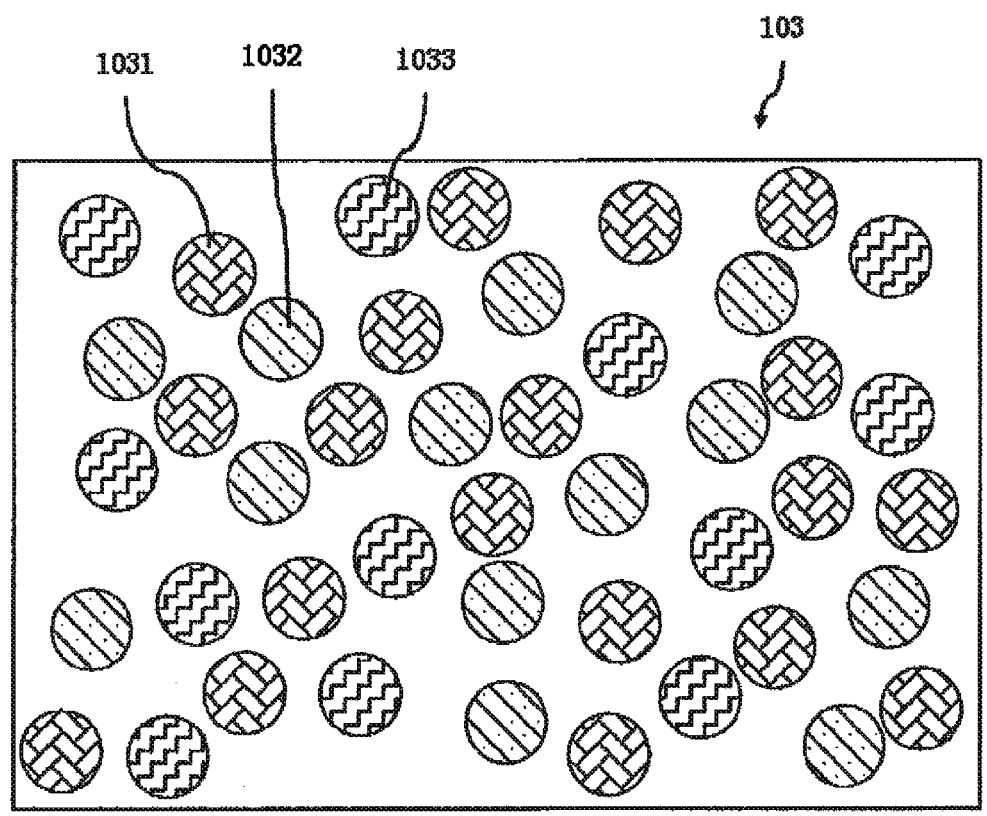
FIG. 7 illustrates a diagram, in a plain view, of a third embodiment of the photoluminescent layer in FIG. 1 or FIG. 2.

In the embodiment, the photoluminescent blue light emitting material 1031, the photoluminescent red light emitting material 1033 and the photoluminescent green light emitting material 1032 are all disposed in the first stratification 401 in a form of rectangular blocks (as shown in FIG. 3 or FIG. 6) or round granules (as shown in FIG. 7).

For a plane on which the photoluminescent layer 103 is located, a sum of a projected area of the photoluminescent green light emitting material 1032 (blocks or granules) to the plane is a first area, a sum of a projected area of the photoluminescent red light emitting material 1033 (blocks or granules) to the plane is a second area, and a sum of a projected area of the photoluminescent blue light emitting material 1031 (blocks or granules) to the plane is a third area.

According to the present invention, any one of the first area, the second area, the third area equals another one of the first area, the second area, the third area which multiplies a predetermined ratio, wherein the predetermined ratio can be 90%, 92%, 94%, 95%, 97%, 99%, 100%, 102%, 104%, 105%, 107%, 109%, 110%. Preferably, the ratio is 100% whereby the first area equals the second area, and the second area equals the third area.

A combination of the photoluminescent blue light emitting material 1031, the photoluminescent green light emitting material 1032, and the photoluminescent red light emitting material 1033 is arranged in a form of a one-dimensional array (FIG. 6) or a two-dimensional array (FIG. 3).

The photoluminescent blue light emitting material 1031, the photoluminescent green light emitting material 1032 and the photoluminescent red light emitting material 1033 are randomly mixed in the first stratification 401.

Alternatively, as shown in FIG. 5, the photoluminescent layer 103 includes a second stratification 501, a third stratification 502, and a fourth stratification 503. The photoluminescent green light emitting material 1032 is located in the second stratification 501. The photoluminescent red light emitting material 1033 is located in the third stratification 502. The photoluminescent blue light emitting material 1031 is disposed in the fourth stratification 503.

A yield of the green light of the photoluminescent green light emitting material 1032 corresponds to the first area and a first thickness of the stratification (the first stratification 401 or the second stratification 501) in which the photoluminescent green light emitting material 1032 is located. A yield of the red light of the photoluminescent red light emitting material 1033 corresponds to the second area and a second thickness of the stratification (the first stratification 401 or the third stratification 502) in which the photoluminescent red light emitting material 1033 is located. A yield of the blue light of the photoluminescent blue light emitting material 1031 corresponds to the third area and a third thickness of the stratification (the first stratification 401 or the fourth stratification 503) in which the photoluminescent blue light emitting material 1031 is located.

Therefore, the color purity (chromaticity) of the generated white light can be adjusted by adjusting a size of the first area and a size of the first thickness of the photoluminescent green light emitting material 1032, and a size of the second area and a size of the second thickness of the photoluminescent red light emitting material 1033, and a size of the third area and a size of the third thickness of the photoluminescent blue light emitting material 1031 in the photoluminescent layer 103.

Through the aforementioned technical solution, a white light source in accordance with the present invention is formed which can overcome the disadvantages of the prior art WOLED such as the difficulty controlled concentrations of the doping materials and the complication of the multi-layer structure which can adversely affect generation and the quality of the white light. The technical solution is advantageous for simplifying the manufacturing process while increasing the stability and usage life of the light emitting device.

Refer to FIG. 2, which illustrates a diagram of a second embodiment of the light emitting device of the present invention. The embodiment is similar to the first embodiment; the differences therebetween are as follows:

In the second embodiment, the ultraviolet light source generating panel 102 further includes a hole injection layer 201, a hole transport layer 202, an electronic transport layer 203, and an electronic injection layer 204.

The hole injection layer 201 is disposed between the anode layer 1023 and the hole transport layer 202, the hole transport layer 202 is disposed between the hole injection layer 201 and the electroluminescent ultraviolet light emitting material layer 1022, the electroluminescent ultraviolet light emitting material layer 1022 is disposed between the hole transport layer 202 and the electronic transport layer 203, the electronic transport layer 203 is disposed between the electroluminescent ultraviolet light emitting material layer 1022 and the electronic injection layer 204, and the electronic injection layer 204 is disposed between the electronic transport layer 203 and the cathode layer 1021.

In summary, although the present invention has been described in preferred embodiments above, the preferred embodiments described above are not intended to limit the invention. Persons skilled in the art can make various modifications to the present invention without departing from the scope of the invention as defined in the claims.

What is claimed is:

1. A light emitting device, comprising:
a substrate including a first surface and a second surface;
an ultraviolet light source generating panel disposed on the first surface of the substrate, the ultraviolet light source generating panel being used for generating ultraviolet light;
a photoluminescent layer disposed on the second surface of the substrate, the photoluminescent layer being used for generating white light when the photoluminescent layer is irradiated by the ultraviolet light;
the ultraviolet light source generating panel comprising:
an anode layer;
a cathode layer;
an electroluminescent ultraviolet light emitting material layer disposed between the anode layer and the cathode layer, the electroluminescent ultraviolet light emitting material layer being used for generating the ultraviolet light when there is a predetermined voltage difference between the anode layer and the cathode layer; and
a power supply being used for applying a voltage to the anode layer and the cathode layer to form the predetermined voltage difference between the anode layer and the cathode layer;
the ultraviolet light source generating panel further comprising:
a hole injection layer;
a hole transport layer;
an electronic transport layer; and
an electronic injection layer;
wherein the hole injection layer is disposed between the anode layer and the hole transport layer, the electroluminescent ultraviolet emitting material layer is disposed between the hole transport layer and the electronic transport layer, the electronic injection layer is disposed between the electronic transport layer and the cathode layer;
the photoluminescent layer comprising:
a photoluminescent blue light emitting material used for emitting blue light when the photoluminescent blue light emitting layer is irradiated by the ultraviolet light;
a photoluminescent green light emitting material used for emitting green light when the photoluminescent green light emitting layer is irradiated by the ultraviolet light; and
a photoluminescent red light emitting material used for emitting red light when the photoluminescent red light emitting layer is irradiated by the ultraviolet light.

2. The light emitting device of claim 1, wherein the photoluminescent layer comprises:
a first stratification, the photoluminescent green light emitting material, the photoluminescent red light emitting material and the photoluminescent blue light emitting material all being located in the first stratification.

3. The light emitting device of claim 2, wherein the photoluminescent blue light emitting material, the photoluminescent green light emitting material and the photoluminescent red light emitting material are all disposed in the first stratification in a form of blocks or granules.

4. The light emitting device of claim 3, wherein a combination of the photoluminescent blue light emitting material, the photoluminescent green light emitting material and the photoluminescent red light emitting material are arranged in a form of a one-dimensional array.

5. The light emitting device of claim 3, wherein a combination of the photoluminescent blue light emitting material, the photoluminescent green light emitting material and the photoluminescent red light emitting material are arranged in a form of a two-dimensional array.

6. The light emitting device of claim 3, wherein the photoluminescent blue light emitting material, the photoluminescent green light emitting material and the photoluminescent red light emitting material are randomly mixed in the first stratification.

7. The light emitting device of claim 1, wherein the photoluminescent layer comprises:
a second stratification, the photoluminescent green light emitting material being located in the second stratification;
a third stratification, the photoluminescent red light emitting material being located in the third stratification; and
a fourth stratification, the photoluminescent blue light emitting material being located in the fourth stratification.

8. A light emitting device comprising:
a substrate including a first surface and a second surface;
an ultraviolet light source generating panel disposed on the first surface of the substrate, the ultraviolet light source generating panel being used for generating ultraviolet light;
a photoluminescent layer disposed on the second surface of the substrate, the photoluminescent layer being used for generating white light when the photoluminescent layer is irradiated by the ultraviolet light;
wherein the ultraviolet light source generating panel comprises:
an anode layer;

a cathode layer;
an electroluminescent ultraviolet light emitting material layer disposed between the anode layer and the cathode layer, the electroluminescent ultraviolet light emitting material layer being used for generating the ultraviolet light when there is a predetermined voltage difference between the anode layer and the cathode layer; and
a power supply being used for applying a voltage to the anode layer and the cathode layer to form the predetermined voltage difference between the anode layer and the cathode layer.

9. The light emitting device of claim 8, wherein the ultraviolet light source generating panel further comprises:
a hole injection layer;
a hole transport layer;
an electronic transport layer; and
an electronic injection layer;
wherein the hole injection layer is disposed between the anode layer and the hole transport layer, the electroluminescent ultraviolet light emitting material layer is disposed between the hole transport layer and the electronic transport layer, and the electronic injection layer is disposed between the electronic transport layer and the cathode layer.

10. The light emitting device of claim 8, wherein the photoluminescent layer comprises:
a photoluminescent blue light emitting material used for emitting blue light when the photoluminescent blue light emitting material is irradiated by the ultraviolet light;
a photoluminescent green light emitting material used for emitting green light when the photoluminescent green light emitting material is irradiated by the ultraviolet light; and
a photoluminescent red light emitting material used for emitting red light when the photoluminescent red light emitting material is irradiated by the ultraviolet light.

11. The light emitting device of claim 10, wherein the photoluminescent layer comprises:
a first stratification, the photoluminescent green light emitting material, the photoluminescent red light emitting material and the photoluminescent blue light emitting material all being located in the first stratification.

12. The light emitting device of claim 11, wherein the photoluminescent blue light emitting material, the photoluminescent green light emitting material and the photoluminescent red light emitting material are all disposed in the first stratification in a form of blocks or granules.

13. The light emitting device of claim 12, wherein a combination of the photoluminescent blue light emitting material, the photoluminescent green light emitting material and the photoluminescent red light emitting material are arranged in a form of a one-dimensional array.

14. The light emitting device of claim 12, wherein a combination of the photoluminescent blue light emitting material, the photoluminescent green light emitting material and the photoluminescent red light emitting material are arranged in a form of a two-dimensional array.

15. The light emitting device of claim 12, wherein the photoluminescent blue light emitting material, the photoluminescent green light emitting material and the photoluminescent red light emitting material are randomly mixed in the first stratification.

16. The light emitting device of claim 10, wherein the photoluminescent layer comprises:
a second stratification, the photoluminescent green light emitting material being located in the second stratification;
a third stratification, the photoluminescent red light emitting material being located in the third stratification; and
a fourth stratification, the photoluminescent blue light emitting material being located in the fourth stratification.

17. The light emitting device of claim 10, wherein for a plane on which the photoluminescent layer is located, a sum of a projected area of the photoluminescent green light emitting material to the plane is a first area, a sum of a projected area of the photoluminescent red light emitting material to the plane is a second area, a sum of a projected area of the photoluminescent blue light emitting material to the plane is a third area;
any one of the first area, the second area and the third area equals another one of the first area, the second area and the third area which multiplies a predetermined ratio, the predetermined ratio being in a range from 90% to 110%.

18. The light emitting device of claim 17, wherein the first area equals the second area, and the second area equals the third area.

19. The light emitting device of claim 17, wherein a yield of the green light of the photoluminescent green light emitting material corresponds to the first area and a first thickness of the stratification in which the photoluminescent green light emitting material is located;
a yield of the red light of the photoluminescent red light emitting material corresponds to the second area and a second thickness of the stratification in which the photoluminescent red light emitting material is located; and
a yield of the blue light of the photoluminescent blue light emitting material corresponds to the third area and a third thickness of the stratification in which the photoluminescent blue light emitting material is located.

* * * * *